(12) United States Patent
Usami

(10) Patent No.: US 10,456,891 B2
(45) Date of Patent: Oct. 29, 2019

(54) GRINDING WHEEL

(71) Applicant: SHIN-ETSU HANDOTAI CO., LTD., Tokyo (JP)

(72) Inventor: Yoshihiro Usami, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 96 days.

(21) Appl. No.: 15/570,643

(22) PCT Filed: Mar. 11, 2016

(86) PCT No.: PCT/JP2016/001362
§ 371 (c)(1),
(2) Date: Oct. 30, 2017

(87) PCT Pub. No.: WO2016/181594
PCT Pub. Date: Nov. 17, 2016

(65) Prior Publication Data
US 2018/0290265 A1    Oct. 11, 2018

(30) Foreign Application Priority Data
May 11, 2015    (JP) .................................. 2015-096632

(51) Int. Cl.
*B24D 7/06*     (2006.01)
*H01L 21/02*    (2006.01)
*B24B 7/22*     (2006.01)

(52) U.S. Cl.
CPC ............... *B24D 7/066* (2013.01); *B24D 7/06* (2013.01); *B24B 7/228* (2013.01); *H01L 21/02013* (2013.01)

(58) Field of Classification Search
CPC .. B24B 7/228; B24D 7/00; B24D 7/06; B24D 7/066; B24D 7/18
See application file for complete search history.

(56) References Cited

U.S. PATENT DOCUMENTS 4,289,541 A * 9/1981 Wallner .................... B24C 1/00
                                                                134/36
4,947,591 A * 8/1990 Risley ..................... B24C 1/086
                                                                134/17
(Continued)

FOREIGN PATENT DOCUMENTS

JP    H09-248769 A    9/1997
JP    H11-156728 A    6/1999
(Continued)

OTHER PUBLICATIONS

May 24, 2016 Search Report issued in International Application No. PCT/JP2016/001362.
(Continued)

*Primary Examiner* — Timothy V Eley
(74) *Attorney, Agent, or Firm* — Oliff PLC

(57) ABSTRACT

A grinding wheel which includes a plurality of vitrified bonded grindstone chips arranged on an outer periphery of an annular base metal thereof, and is configured to grind a workpiece with use of the grindstone chips while rotating the annular base metal, wherein each of the vitrified bonded grindstone chips is configured in such a manner that, in a rectangular parallelepiped including a rectangular grinding surface which is placed on an opposite side of the annular base metal and grinds the workpiece and four side surfaces adjacent to grinding surface, four ridge portions each of which is provided between the side surfaces are C-chamfered, each long side of the grinding surface is arranged along the outer periphery of the annular base metal, and each of the four ridge portions is C-chamfered in a range which is ⅕ or more of a length of each short side of the grinding surface.

4 Claims, 6 Drawing Sheets

(56) References Cited

U.S. PATENT DOCUMENTS

| | | | | |
|---|---|---|---|---|
| 5,308,404 | A * | 5/1994 | Yam | B08B 7/02 |
| | | | | 134/6 |
| 5,607,480 | A * | 3/1997 | Beaty | A61C 8/0012 |
| | | | | 623/23.5 |
| 5,637,030 | A * | 6/1997 | Chopra | B24C 1/045 |
| | | | | 451/39 |
| 5,785,579 | A * | 7/1998 | Grondin | C03C 12/00 |
| | | | | 451/38 |
| 5,865,620 | A * | 2/1999 | Kutsch | A61C 3/025 |
| | | | | 433/88 |
| 5,964,644 | A * | 10/1999 | Rhoades | B24C 1/06 |
| | | | | 451/28 |
| 6,095,903 | A * | 8/2000 | Rien | B24C 1/003 |
| | | | | 451/28 |
| 8,758,461 | B2 * | 6/2014 | Yener | C09K 3/1409 |
| | | | | 51/293 |
| 9,321,147 | B2 * | 4/2016 | Cho | B21B 45/06 |
| 2001/0023351 | A1 * | 9/2001 | Eilers | A61B 17/545 |
| | | | | 606/131 |
| 2002/0102920 | A1 | 8/2002 | Vogtmann et al. | |
| 2003/0180537 | A1 * | 9/2003 | Meyer | B01D 39/06 |
| | | | | 428/404 |
| 2006/0219825 | A1 * | 10/2006 | Rohring | B02C 19/06 |
| | | | | 241/5 |
| 2009/0107629 | A1 * | 4/2009 | Oguri | B24C 1/06 |
| | | | | 156/279 |
| 2014/0186585 | A1 * | 7/2014 | Field, III | B24C 11/00 |
| | | | | 428/155 |

FOREIGN PATENT DOCUMENTS

| | | |
|---|---|---|
| JP | 2002-001671 A | 1/2002 |
| JP | 2003-062740 A | 3/2003 |
| JP | 2006-224201 A | 8/2006 |
| JP | 2009-279742 | 12/2009 |

OTHER PUBLICATIONS

Oct. 31, 2018 Office Action issued in Chinese Patent Application No. 201680024410.7.

May 31, 2019 Office Action issued in Taiwanese Patent Application No. 105107874.

* cited by examiner

GRINDING WHEEL

TECHNICAL FIELD

The present invention relates to a grinding wheel which is attached to a grinding apparatus for use.

BACKGROUND ART

In precision machining of a discoid workpiece such as a semiconductor wafer, there has been conventionally a grinding method called double-disc grinding to grind both surfaces at the same time. In the double-disc grinding, a cup-type wheel is generally used as a grinding wheel, and it has a plurality of grindstone chips on an outer periphery.

In the grinding machining using this grinding wheel, when a workpiece is ground, the grindstone chips are abraded away, and replacement of the grinding wheel is required. Thus, in terms of suppressing an increase in cost, there is a demand to extend a life span of the grinding wheel.

CITATION LIST

Patent Literatures

Patent Literature 1: Japanese Unexamined Patent Publication (Kokai) No. Hei 11-156728
Patent Literature 2: Japanese Unexamined Patent Publication (Kokai) No. Hei 9-248769
Patent Literature 3: Japanese Unexamined Patent Publication (Kokai) No. 2009-279742

DISCLOSURE OF INVENTION

Problem to be Solved by the Invention

As a method for extending a life span of the grinding wheel, heightening a dimension of the grindstone chips can be considered. However, when a height dimension of general square-pillar-shaped grindstone chips is simply increased as described Patent Literature 1, the grindstone chips cannot withstand bending stress at the time of grinding a workpiece and get broken.

Thus, to avoid the breakage when the grindstone chips have an increased height dimension, realizing a grindstone shape having long sides substantially parallel to a rotating direction of the grinding wheel can be considered.

Further, as a shape of the grindstone having long sides substantially parallel to the rotating direction, forming the grindstone into a rectangular parallelepiped shape can be considered. However, in the rectangular parallelepiped chip, ridge portions each having an inner angle 90° as seen from a height direction (i.e., four ridge portion provided between four side surfaces adjacent to a rectangular grinding surface in the rectangular parallelepiped grindstone chip) vertically cut into a workpiece center, and a moving load to a rotating direction increases, the workpiece central portion is thus apt to get intensively damaged, and a shape control near the workpiece center is difficult.

Thus, although a purpose is different, as described in Patent Literature 2 or Patent Literature 3, it can be considered that forming a shape of the grindstone chip into a regular hexagon or forming an end of the grindstone chip into a semicircular shape can suppress the damage, but there is a problem that the long sides substantially parallel to the rotating direction cannot be provided or shape forming becomes complicated.

In view of the problem, it is an object of the present invention to provide a grinding wheel which does not get broken at the time of grinding and can suppress intensive damage to a workpiece caused due to excessive cutting into a workpiece central portion by simple shape forming.

Means for Solving Problem

To achieve the object, the present invention provides a grinding wheel comprising a plurality of vitrified bonded grindstone chips arranged on an outer periphery of an annular base metal thereof, the grinding wheel being configured to grind a workpiece with the use of the grindstone chips while rotating the annular base metal, wherein each of the vitrified bonded grindstone chips is configured in such a manner that:

in a rectangular parallelepiped comprising a rectangular grinding surface which is placed on an opposite side of the annular base metal and grinds the workpiece and four side surfaces adjacent to the grinding surface, four ridge portions each of which is provided between the side surfaces are C-chamfered;

each long side of the grinding surface is arranged along the outer periphery of the annular base metal; and each of the four ridge portions is C-chamfered in a range which is $1/5$ or more of a length of each short side of the grinding surface.

According to the grinding wheel, even if a height (a length of each C-chamfered ridge portion) of the vitrified bonded grindstone chip (which will be simply referred to as a grindstone chip hereinafter) is increased, breakage at the time of grinding can be avoided. Thus, the height of the grindstone chip can be increased to extend a life span of the grinding wheel.

Further, the grinding wheel can very effectively suppress the intensive damage to the workpiece caused due to excessive cutting into a workpiece central portion at the time of grinding the workpiece by the simple shape forming.

At this time, a length of each long side of the grinding surface can be $1/2$ or more of a length of each of the C-chamfered ridge portions.

With this structure, even if a height dimension of the grindstone chip is increased, the breakage of the grindstone chip caused due to bending stress at the time of grinding the workpiece can be effectively avoided.

Furthermore, the grinding wheel can be for double-disc grinding.

The grinding wheel according to the present invention is preferable for double-disc grinding.

Effect of the Invention

As described above, according to the present invention, even if the height dimension of the grindstone chip is increased, the breakage at the time of grinding can be avoided, and hence a height of the grindstone chip can be increased to extend a life span of the grinding wheel. Moreover, the intensive damage to the workpiece caused due to excessive cutting into the workpiece central portion can be effectively suppressed by using the simple shape forming.

BEST MODE(S) FOR CARRYING OUT THE INVENTION

Although an embodiment of the present invention will now be described hereinafter, the present invention is not restricted thereto.

As described above, as a method for extending a life span of a grinding wheel, increasing a height dimension of a grindstone chip can be considered, but problems that a grindstone is broken when the grindstone chip is simply heightened, a central portion of a workpiece as a grinding target is intensively damaged when the grindstone chip is formed into a rectangular parallelepiped shape, and the like are observed. Thus, the present inventor has paid attention to a shape of the grindstone chip for grinding and arrangement on a annular base metal, and conducted various kinds of experiments.

Consequently, as described above, when a grindstone chip having a rectangular parallelepiped shape is arranged in such a manner that long sides of its rectangular grinding surface are arranged along an outer periphery of an annular base metal (namely, in such a manner that they become substantially parallel to a rotating direction of a grinding wheel), breakage of the grindstone chip at the time of grinding can be avoided.

Additionally, in case of the grindstone chip having the parallelepiped shape, since ridge portions each having an inner angle 90° as seen from a height direction (i.e., in the grindstone chip having the rectangular parallelepiped shape, four ridge portions between four side surfaces adjacent to a rectangular grinding surface) vertically cut into a workpiece center and a moving load to the rotating direction becomes large, the central portion of the workpiece is apt to be intensively damaged. However, the present inventor repeatedly conducted experiments and found out that performing C-chamfering to the four ridge portions in a range of ⅕ or more of short sides of the rectangular grinding surface enables suppressing the intensive damage to the central portion of the workpiece, thereby bringing the present invention to completion.

Although the present invention will be described hereinafter in detail as an embodiment with reference to the drawings, the present invention is not restricted thereto.

Figure 1:
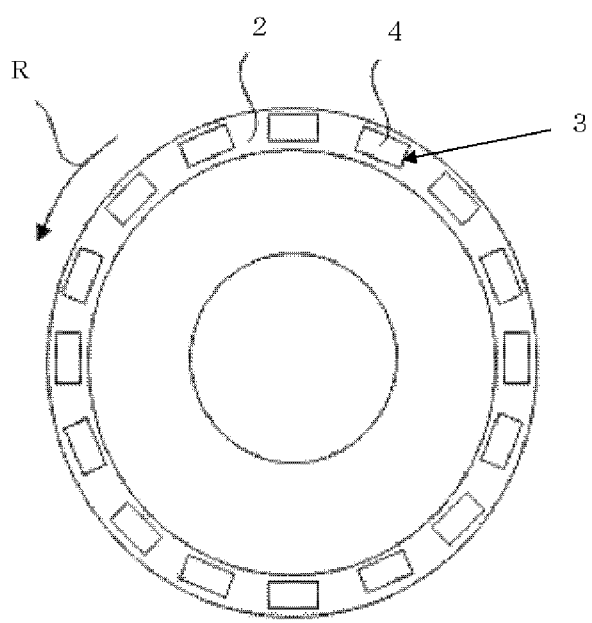
FIG. 1 is a front view showing an example of a grinding wheel according to the present invention.
Figure 2:
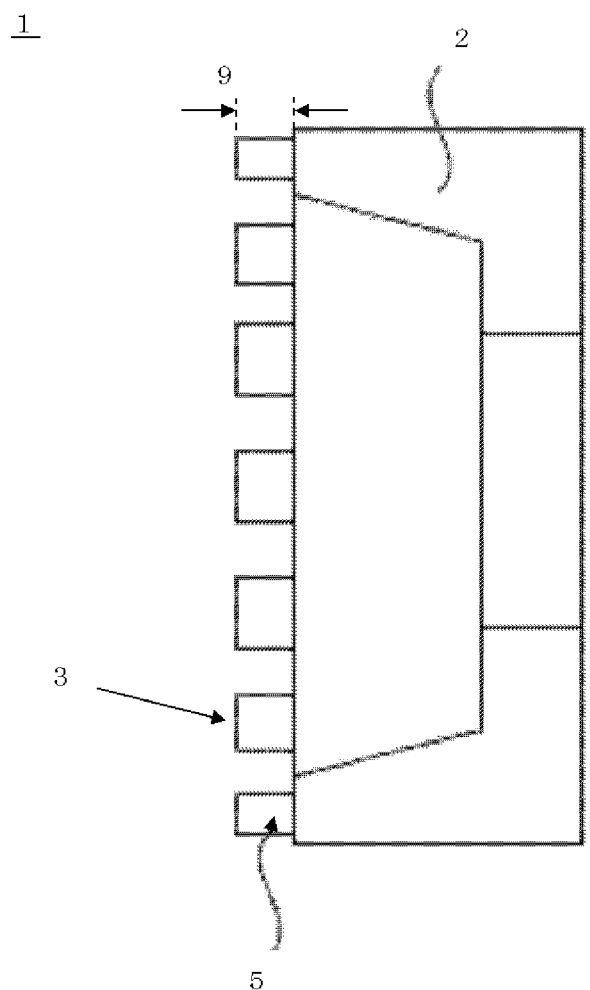
FIG. 2 is a side view showing an example of the grinding wheel according to the present invention.

FIG. 1 shows an example of a grinding wheel according to the present invention. It is a front view seen from a side which comes into contact with a workpiece as a grinding target. Further, FIG. 2 is a side view. A grinding wheel 1 according to the present invention includes an annular base metal (which will be also simply referred to as a base metal hereinafter) 2 and a plurality of vitrified bonded grindstone chips 3.

As the base metal 2, it is possible to adopt a base metal on which the grindstone chips 3 can be arranged and which can be rotated by a motor or the like at the time of grinding. It is to be noted that a rotating direction is denoted by R.

Furthermore, as a shape of each grindstone chip 3, a part of a rectangular parallelepiped is chamfered. FIGS. 1 and 2 show a simplified state where chamfering is omitted.

The shape of the grindstone chip 3 will now be more specifically described. First, it has a rectangular grinding surface 4 at a position opposite to a side fixed on the base metal 2, and also has four rectangular side surfaces 5 adjacent to the grinding surface 4. Each ridge portion, which is between side surfaces adjacent to each other, of the four side surfaces 5 is C-chamfered.

It is to be noted that the rectangular parallelepiped of the grindstone chip 3 and the rectangular grinding surface 4 described herein mean a shape of the grindstone chip 3 before the chamfering and a shape of the grinding surface 4 before the chamfering, respectively. Moreover, the long side and the short side of the rectangular grinding surface 4 described herein mean a long side and a short side in a rectangular state before the chamfering.

Figure 3:
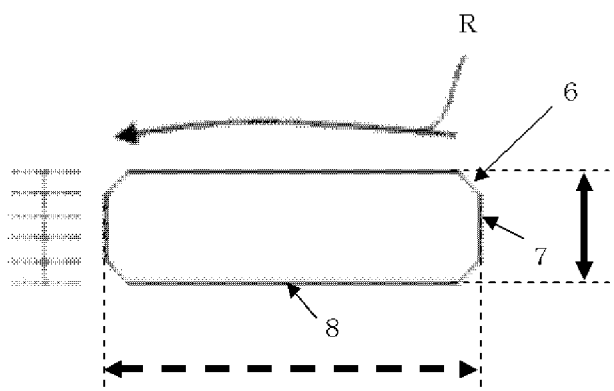
FIG. 3 is an explanatory drawing showing an example of chamfered ridge portions (Example 1)
Figure 4:
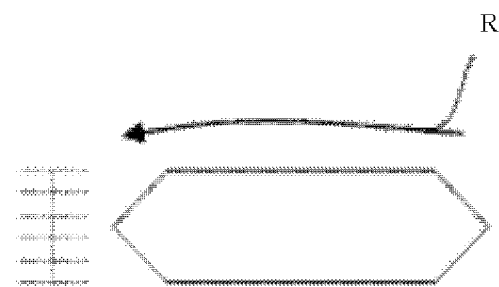
FIG. 4 is an explanatory drawing showing another example of the chamfered ridge portions (Example 2)

Here, FIGS. 3 and 4 show examples of the C-chamfered ridge portions. FIGS. 3 and 4 show the grindstone chip 3 seen from the grinding-surface-4 side. In both the drawings, four ridge portions 6 are C-chamfered.

In regard to a chamfering amount, in the present invention, C-chamfering each ridge portion in a range of ⅕ or more of a length of each short side 7 (see an arrow of a solid line in FIG. 3) of the rectangular grinding surface 4 can suffice, and the chamfering amount is not restricted in particular. FIG. 3 shows an example where each ridge portion is C-chamfered by an amount corresponding to ⅕ of a length of a short side 7, and the grinding surface 4 has an octagonal shape. On the other hand, FIG. 4 shows an example where each ridge portion is C-chamfered by an amount corresponding to ½ a length of a short length 7 and the grinding surface 4 has a hexagonal shape.

Since the C-chamfering is performed as described above, a central portion of a workpiece is not excessively cut at the time of grinding the workpiece, and the central portion of the workpiece can be prevented from being intensively damaged. Additionally, just performing the chamfering can suffice, and hence shape forming is easy.

On the other hand, when the chamfering amount is less than ⅕ of the length of the short side 7, the excessive cutting cannot be effectively avoided, and the workpiece gets damaged.

Further, in the present invention, the arrangement of the rectangular parallelepiped grindstone chips 3 is elaborated. The plurality of the grindstone chips 3 are arranged along an outer periphery of the base metal 2. The number of the chips to be arranged is not restricted in particular, and it can be appropriately determined. At this time, the chips are arranged in such a manner that the long sides 8 of the grinding surface 4 are arranged along the outer periphery of the base metal 2. That is, since the grindstone chips 3 are arranged in such a manner that the long sides 8 become substantially parallel to a rotating direction of the grinding wheel 1, it is possible to withstand bending stress at the time of grinding the workpiece and effectively avoid breakage of the grindstone chips 3.

In conventional products, when a height of each grindstone chip is increased to extend a life span of the grinding wheel, the grindstone chips get broken due to the bending stress. However, in the present invention, since the arrangement is elaborated and therefore resistance properties to the bending stress are provided, the height of each grindstone chip 3 can be increased while avoiding the damage, and the life span of the grinding wheel 1 can be extended. It is to be noted that the height 9 of the grindstone chip 3 means a length of each C-chamfered ridge portion as shown in FIG. 2.

Furthermore, to avoid such damage as described above, when a length of each long side 8 of the grinding surface 4 (see an arrow of a dotted line in FIG. 3) is ½ or more of the height 9 of the grindstone chip 3, the effect is enhanced. The longer the length of each long side 8 of the grinding surface 4 is to the height of the grindstone chip 3, the higher the resistance properties to the bending stress is, which is preferable.

A grinding apparatus including the grinding wheel 1 according to the present invention will now be described. Although a double-disc grinding apparatus will be described here, the grinding wheel 1 according to the present invention is not restricted to one for the double-disc grinding apparatus. It is possible to adopt the grinding wheel 1 which can grind a workpiece with the grindstone chips 3 while rotating the grinding wheel 1 itself, and the grinding wheel 1 can be used in any grinding apparatus.

Figure 5:
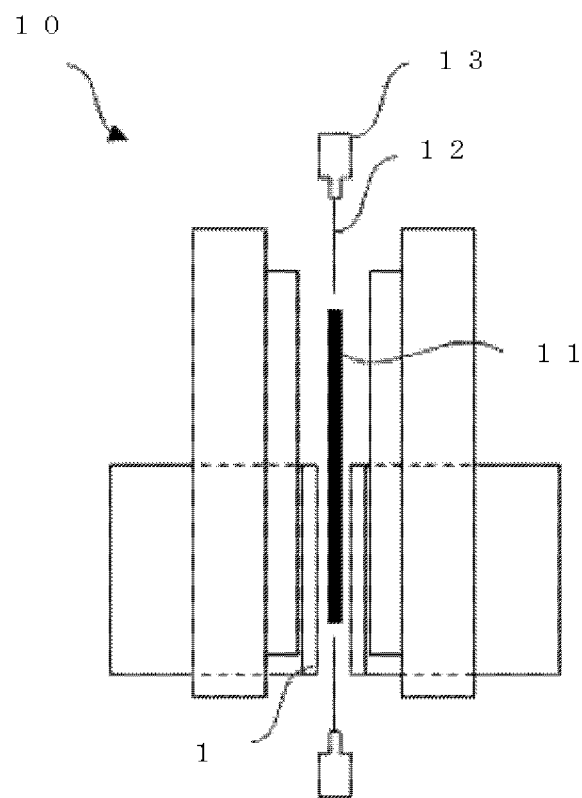
FIG. 5 is an explanatory drawing showing an example of a double-disc grinding apparatus.

FIG. 5 shows an example of a double-disc grinding apparatus 10. The double-disc grinding apparatus 10 mainly includes a pair of grinding wheels 1, a rotatable carrier 12 which holds a workpiece 11 from an outer peripheral side along a radial direction of the workpiece 11, and a holder portion 13 having the carrier 12 disposed thereto.

When the pair of grinding wheels 1 are rotated while rotating the carrier 12 and the holder portion 13 to rotate the workpiece 11, both surfaces of the workpiece 11 can be ground at the same time. When the grinding wheels 1 of the present invention are used, the grindstone chips 3 are not broken, a central portion of the workpiece 11 is not intensively damaged, and high-quality grinding can be carried out.

EXAMPLES

Although the present invention will now be described hereinafter in detail with reference to examples and comparative examples, the present invention is not restricted thereto.

Examples 1 and 2 and Comparative Examples 1 and 2

Such a double-disc grinding apparatus 10 for workpieces as shown in FIG. 5 was used to perform double-disc grinding to a silicon wafer having a diameter of 300 mm. This silicon wafer was sliced off from an ingot manufactured by a CZ method (a Czochralski method).

First, grinding wheels each having a plurality of vitrified bonded grindstone chips shown in FIG. 3, each of which is formed into a shape that a C-chamfered region is ⅕ of a short side of a grinding surface, arranged thereon were provided in such a double-disc grinding apparatus 10 as shown in FIG. 5, and five silicon wafers were ground (Example 1).

Then, grinding wheels each having a plurality of vitrified bonded grindstone chips shown in FIG. 4, each of which is formed into a shape that a C-chamfered region is ½ of a short side of a grinding surface, arranged thereon were provided in such a double-disc grinding apparatus 10 as shown in FIG. 5, and five silicon wafers were ground (Example 2).

Figure 6:
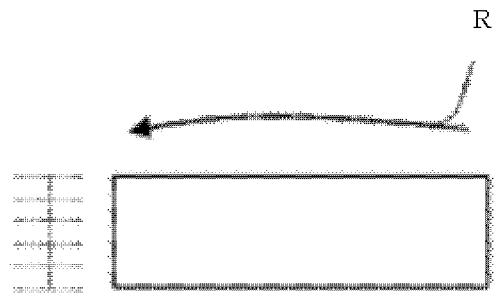
FIG. 6 is an explanatory drawing showing ridge portions in a grindstone chip used in Comparative Example 1.

Subsequently, grinding wheels each having a plurality of unchamfered vitrified bonded grindstone chips which are shown in FIG. 6 arranged thereon were provided in a double-disc grinding apparatus which is the same as that shown in FIG. 5, and five silicon wafers were ground (Comparative Example 1).

Figure 7:
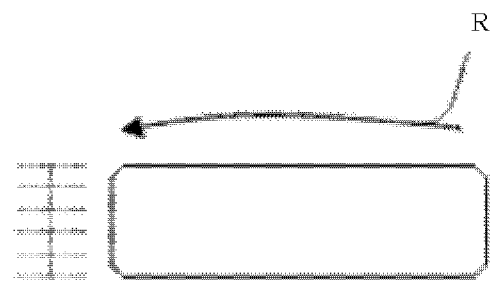
FIG. 7 is an explanatory drawing showing ridge portions in a grindstone chip used in Comparative Example 2.
Figure 8:
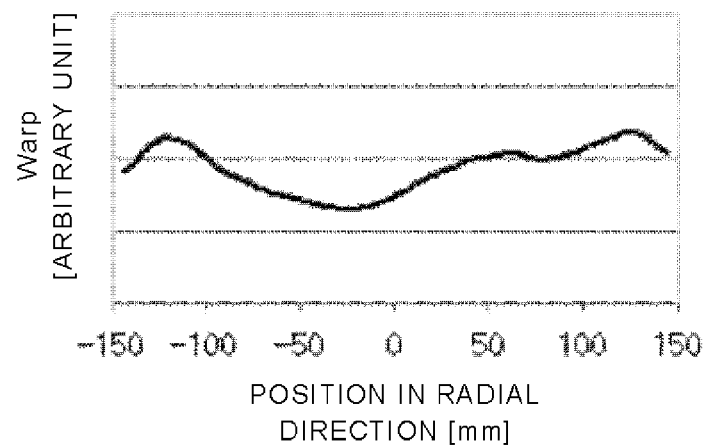
FIG. 8 is a graph showing a measurement result of a warp shape in Example 1.
Figure 9:
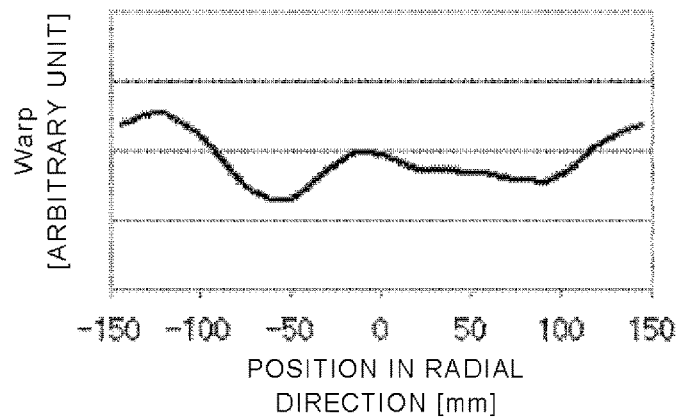
FIG. 9 is a graph showing a measurement result of a warp shape in Example 2.
Figure 10:
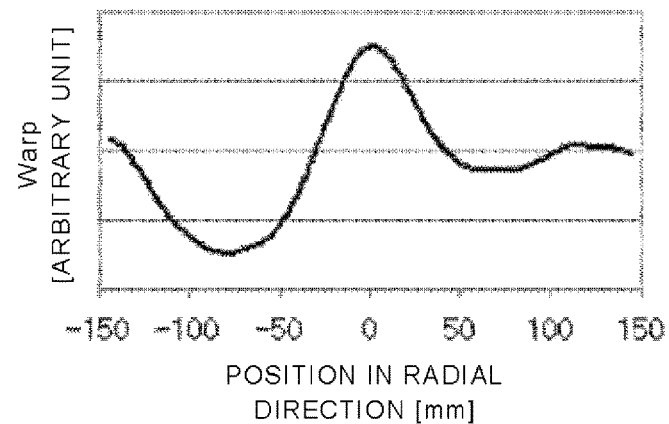
FIG. 10 is a graph showing a measurement result of a warp shape in Comparative Example 1.
Figure 11:
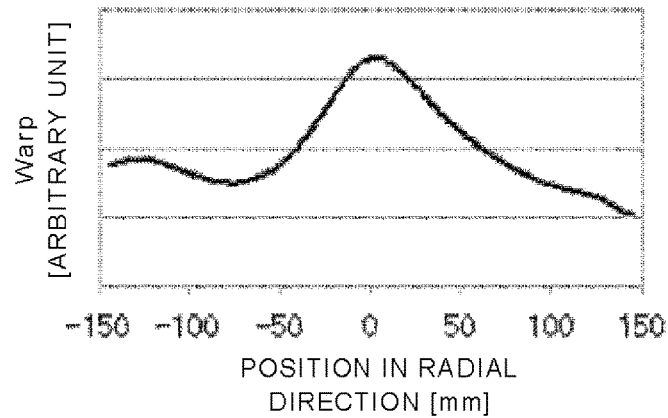
FIG. 11 is a graph showing a measurement result of a warp shape in Comparative Example 2.

At last, grinding wheels each having a plurality of vitrified bonded grindstone chips shown in FIG. 7, each of which is formed into a shape that a C-chamfered region is ⅛ of a short side of a grinding surface, arranged thereon were provided in a double-disc grinding apparatus which is the same as that shown in FIG. 5, and five silicon wafers were ground (Comparative Example 2).

The grindstone chips in Examples 1 and 2 and Comparative Examples 1 and 2 described above are all formed into a shape in which a height is 10 mm, a length of each long side substantially parallel to a rotating direction is 5 mm, and a length of each short side is 3 mm.

At the time of grinding, no grindstone chip was broken in all of Examples 1 and 2 and Comparative Examples 1 and 2.

It is to be noted that, aside from Examples 1 and 2 and Comparative Examples 1 and 2, square-pillar-shaped grindstone chips each having a height of 10 mm and a side length of 3 mm (i.e., chips formed into a shape that respective sides of a grinding surface have the same length and side lengths have no difference) were also evaluated (Comparative Example 3).

However, in this Comparative Example 3, all the grindstone chips were broken, and no silicon wafer was ground.

As evaluation of the ground silicon wafers, a warp shape of each ground silicon wafer or a variation (ΔBow) of Bow (a magnitude and a direction of a warp) before and after grinding can be used as an index.

When a warp shape of a central portion (a range with a radius of approximately 50 mm) after grinding has a precipitous convex or concave shape, it can be understood that either a front or back surface got intensively damaged, and an imbalance of associated residual stress was caused on the front and back surfaces.

Moreover, with ΔBow, the damage to the front and back surfaces due to grinding or a balance of the associated residual stress can be evaluated as a numerical value. When the front and back surfaces have the similar damage or the similar associated residual stress, ΔBow approximates zero.

In measurement of the warp shape or Bow, SBW-330 (manufactured by Kobelco Research Institute, Inc.) was used.

It is to be noted that ΔBow is preferably −5 μm or more and 5 μm or less.

FIGS. 8 to 11 show warp shapes after grinding the respective silicon wafers with the shapes of the grindstone chips according to Examples 1 and 2 and Comparative Examples 1 and 2.

A precipitous change in warp shape of the central portion is not observed in Examples 1 and 2. However, formation of a radical convex part was observed in the central portion in Comparative Examples 1 and 2, and it can be understood that that either a front or back surface got intensively damaged, and an imbalance of associated residual stress was caused on the front and back surfaces.

Figure 12:
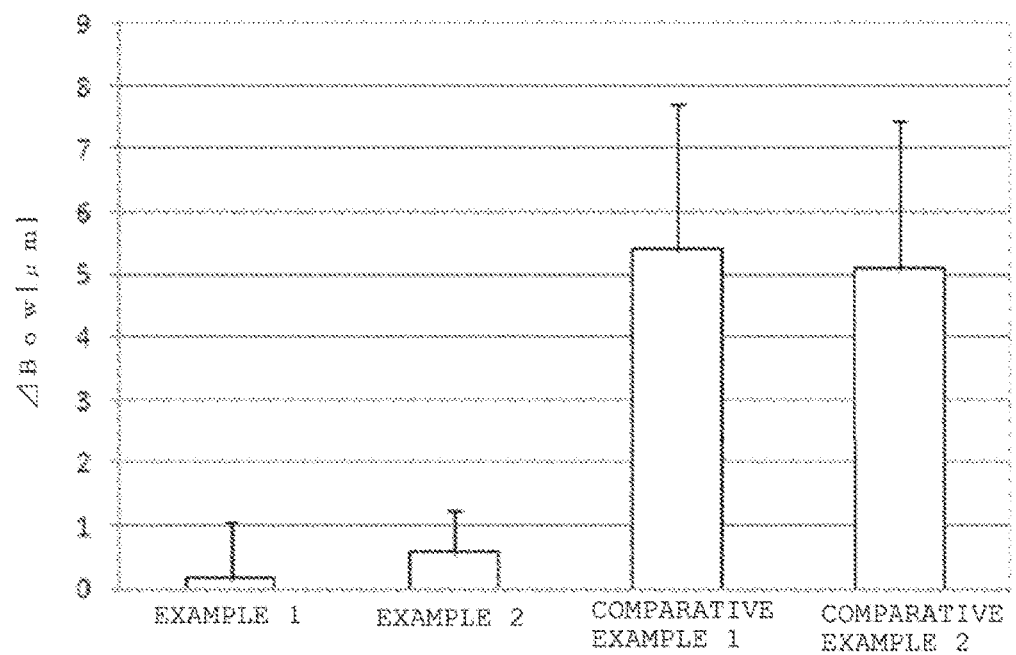
FIG. 12 is a graph showing average variations of Bow before and after grinding in Examples 1 and 2 and Comparative Examples 1 and 2.

FIG. 12 shows average variations of Bow before and after grinding when five silicon wafers were ground with the shapes of the grindstone chips according to Examples 1 and 2 and Comparative Examples 1 and 2.

An error bar represents a deviation. Example 1 has $\Delta Bow=0.17$ μm, Example 2 has $\Delta Bow=0.57$ μm, and both are excellent. On the other hand, Comparative Example 1 has $\Delta Bow=5.39$ μm, Comparative Example 2 has $\Delta Bow=5.10$ μm, and it can be understood that the residual stress is off-balance on the front and back surfaces.

It can be understood from the above results that the intensive damage to the central portion of each wafer surface can be suppressed by setting the C-chamfered region to ⅕ or more of each short side of the rectangular grinding surface like Examples 1 and 2 which embody the present invention. On the other hand, in Comparative Examples 1 and 2 which do not embody the present invention, the central portion of each wafer surface got intensively damaged, and the warp shape or Bow was adversely affected.

It is to be noted that the present invention is not restricted to the foregoing embodiment. The foregoing embodiment is an illustrative example, and any example which has substantially the same structure and exerts the same functions and effects as the technical concept described in claims of the present invention is included in the technical scope of the present invention.

The invention claimed is:

1. A grinding wheel comprising a plurality of vitrified bonded grindstone chips arranged on an outer periphery of an annular base metal thereof, the grinding wheel being configured to grind a workpiece with the use of the grindstone chips while rotating the annular base metal, wherein each of the vitrified bonded grindstone chips is configured in such a manner that:

in a rectangular parallelepiped comprising:

a rectangular grinding surface that is placed on an opposite side of the annular base metal and grinds the workpiece; and four side surfaces adjacent to the grinding surface, four ridge portions, each of which is provided between the side surfaces, are C-chamfered;

the rectangular grinding surface comprises a plurality of long sides and a plurality of short sides;

each long side is longer than each short side;

each long side of the grinding surface is arranged along the outer periphery of the annular base metal; and each of the four ridge portions is C-chamfered in a range that is ⅕ or more of a length of each short side of the grinding surface.

2. The grinding wheel according to claim 1, wherein a length of each long side of the grinding surface is ½ or more of a length of each of the C-chamfered ridge portions.

3. The grinding wheel according to claim 2, wherein the grinding wheel is configured for double-disc grinding.

4. The grinding wheel according to claim 1, wherein the grinding wheel is configured for double-disc grinding.

* * * * *